United States Patent
Park et al.

(10) Patent No.: US 8,332,720 B2
(45) Date of Patent: Dec. 11, 2012

(54) APPARATUS AND METHOD FOR DECODING IN MOBILE COMMUNICATION SYSTEM

(75) Inventors: Sung-Jin Park, Seoul (KR); Hyun-Seok Oh, Seoul (KR)

(73) Assignee: Samsung Electronics Co., Ltd (KR)

( * ) Notice: Subject to any disclaimer, the term of this patent is extended or adjusted under 35 U.S.C. 154(b) by 974 days.

(21) Appl. No.: 12/363,253

(22) Filed: Jan. 30, 2009

(65) Prior Publication Data
US 2009/0193323 A1    Jul. 30, 2009

(30) Foreign Application Priority Data

Jan. 30, 2008 (KR) .................. 10-2008-0009477

(51) Int. Cl.
*H03M 13/00* (2006.01)
(52) U.S. Cl. ......... 714/758; 714/752; 714/755; 375/341
(58) Field of Classification Search .............. 714/752, 714/755, 758; 375/341
See application file for complete search history.

(56) References Cited

U.S. PATENT DOCUMENTS

| | | | | |
|---|---|---|---|---|
| 5,606,569 | A  * | 2/1997 | MacDonald et al. | 714/758 |
| 5,944,844 | A  * | 8/1999 | Piirainen et al. | 714/704 |
| 6,378,106 | B1 * | 4/2002 | Allpress et al. | 714/795 |
| 6,738,941 | B1 * | 5/2004 | Todoroki | 714/755 |
| 2002/0057748 | A1 * | 5/2002 | Rick | 375/341 |
| 2002/0075964 | A1 * | 6/2002 | Okumura | 375/259 |
| 2005/0229075 | A1 * | 10/2005 | Berkmann et al. | 714/758 |
| 2006/0117245 | A1 * | 6/2006 | Fisher-Jeffes et al. | 714/792 |
| 2007/0133423 | A1 * | 6/2007 | Okumura | 370/248 |
| 2007/0234190 | A1 * | 10/2007 | Watanabe et al. | 714/795 |
| 2009/0238311 | A1 * | 9/2009 | Schmidl et al. | 375/341 |

* cited by examiner

*Primary Examiner* — Sam Rizk
(74) *Attorney, Agent, or Firm* — The Farrell Law Firm, P.C.

(57) ABSTRACT

Provided are an apparatus and a method for improving the performance of a decoder by improving a decoding speed when correcting an error of a control signal in Long Term Evolution (LTE). The apparatus includes an error determination unit for performing a traceback operation on a received signal, and simultaneously determining if an error has been generated to the received signal.

14 Claims, 8 Drawing Sheets

APPARATUS AND METHOD FOR DECODING IN MOBILE COMMUNICATION SYSTEM

PRIORITY

This application claims priority under 35 U.S.C. §119 to an application filed in the Korean Intellectual Property Office on Jan. 30, 2008 and assigned Serial No. 10-2008-0009477, the contents of which are incorporated herein by reference.

BACKGROUND OF THE INVENTION

1. Field of the Invention

The present invention relates generally to a Viterbi decoder of a mobile communication system, and in particular, to an apparatus and a method for improving the performance of a decoder by improving a decoding speed during error correction of a control signal in Long Term Evolution (LTE).

2. Description of the Related Art

A mobile communication system is being standardized and having as one of its core features efficient cooperation between a wired communication network and a wireless communication network as in integrated service as well as simple wireless communication service. Therefore, development of technology for transmitting high capacity data approaching the capacity of a wired communication network in a wireless communication network is required.

As a high-speed high-capacity communication system that can process and transmit various information such as images, wired data, etc. as well as a voice-oriented service is required, an appropriate channel coding method that can improve system performance by increasing a system transmission efficiency is an essential element. Also, in a wireless channel environment existing in a mobile communication system, unlike a wired channel environment, errors are generated due to various factors such as multipath interference, shadowing, radio wave attenuation, a time-varying noise, interference and fading, etc., so that information loss can occur. The information loss acts as a factor that deteriorates the performance of the entire mobile communication system by causing serious distortion to an actual transmission signal.

Generally, the reliability of a system is raised by using various error control techniques depending on the character of a channel in order to reduce this information loss. One of the fundamental methods of these error control techniques is to use an error correction code. A general mobile communication system uses a Viterbi decoder in order to correct an error associated with a channel noise. A frequently used method for correcting an error associated with channel noise is a decoding technique of searching for a Maximum Likelihood (ML) path regarding a survivor path through a traceback operation with respect to data coded with a convolution code.

The above-described decoding technique through the traceback operation is a method of searching for the ML path by tracing back, from back to forth, survivor path information created after an Add Compare Select (ACS) operation is performed. A decoding technique using a traceback operation of a Window mode is described as an example. When performing a traceback operation, a received signal to be decoded is decoded using a characteristic that even when an initial state value is arbitrarily set, the set value converges to the ML path when passing through sections to some degree. When the length of a received signal to be decoded is long, the decoder cuts the length of the received signal with a predetermined length, performs a training section on a length corresponding to a window mode of a predetermined size, and performs a decoding operation from a section after the training section.

FIG. 1 is a timing diagram illustrating an operation of a decoder through a traceback operation of a general mobile communication system.

Referring to FIG. 1, when receiving an input signal, the decoder performs an Add Compare Select (ACS) operation, and performs a traceback operation in the form of a window mode. At this point, the decoder performs the traceback operation using two windows in order to perform a successive decoding operation.

First, a traceback operation 100 for TB (B) and TB (A) is performed using a first Window A, and a traceback operation 110 for TB (C) and TB (B) is performed using a second Window B, so that traceback operations for the windows are performed in turns. Here, TB (B) of Window A represents a training section, and TB (A) represents a decoding section.

Accordingly, the decoder outputs, in turn, results of tracebacks of Window A and the Window B. That is, the decoder outputs (101) a result of Window A (100), and outputs (111) a result of Window B (110). After that, the decoder outputs (121) a result of Window A (100), and outputs a result of Window B again.

At this point, an initial output for an initial input signal is different by three sections, so that when an input signal corresponding to a fourth section is generated, the decoder outputs a result of the initial input.

FIG. 2 is a timing diagram illustrating another operation of a decoder through a traceback operation of a general mobile communication system.

Referring to FIG. 2, the operation process of the decoder one in which a tail biting code is used, in which a received signal is lengthened and the lengthened signal is decoded.

In other words, the decoder generates a lengthened signal called IN (T) IN (A) by attaching IN (T)(201) obtained by copying an input signal IN (A)(203) to the input signal IN (A)(203), and performs a decoding operation on the signal IN (T) IN (A). At this point, the decoder twice performs the traceback operations on the input signal IN (A) and outputs a result thereof Before outputting the result, the decoder determines whether there exists an error through a Cyclic Redundancy Check (CRC) check. When an error is generated during the first traceback operation, the decoder performs the second traceback operation.

The above-described decoder improves a decoding performance by performing an iterative traceback operation. However, the decoder requires a block called Last In First Out (LIFO) block in order to correct information output backward while the traceback operation is performed, and performs a CRC check after storing a decoded bit in the LIFO. This process creates an operation delay in a CRC check process.

SUMMARY OF THE INVENTION

An object of the present invention is to provide an apparatus and a method for improving a decoding performance in a mobile communication system.

Another object of the present invention is to provide an apparatus and a method for performing a reverse CRC check and a traceback operation, simultaneously, during a decoding operation of a mobile communication system.

Still another object of the present invention is to provide an apparatus and a method for reducing a decoding time by performing a CRC check and a reverse CRC check during a decoding operation in a mobile communication system.

According to an aspect of the present invention, an apparatus for improving a decoding performance in a mobile communication system includes an error determination unit for performing a traceback operation on a received signal, and simultaneously, determining if an error has been generated in the received signal, and when the error has been generated, again determining is an error has been generated, and when an error has not been generated, outputting a decoded result.

According to another aspect of the present invention, a method for improving a decoding performance in a mobile communication system includes performing a traceback operation on a received signal, and simultaneously, determining if an error has been generated to the received signal; when an error has been generated, again determining if an error has been generated; and when an error has not been generated, outputting a decoded result.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 3:
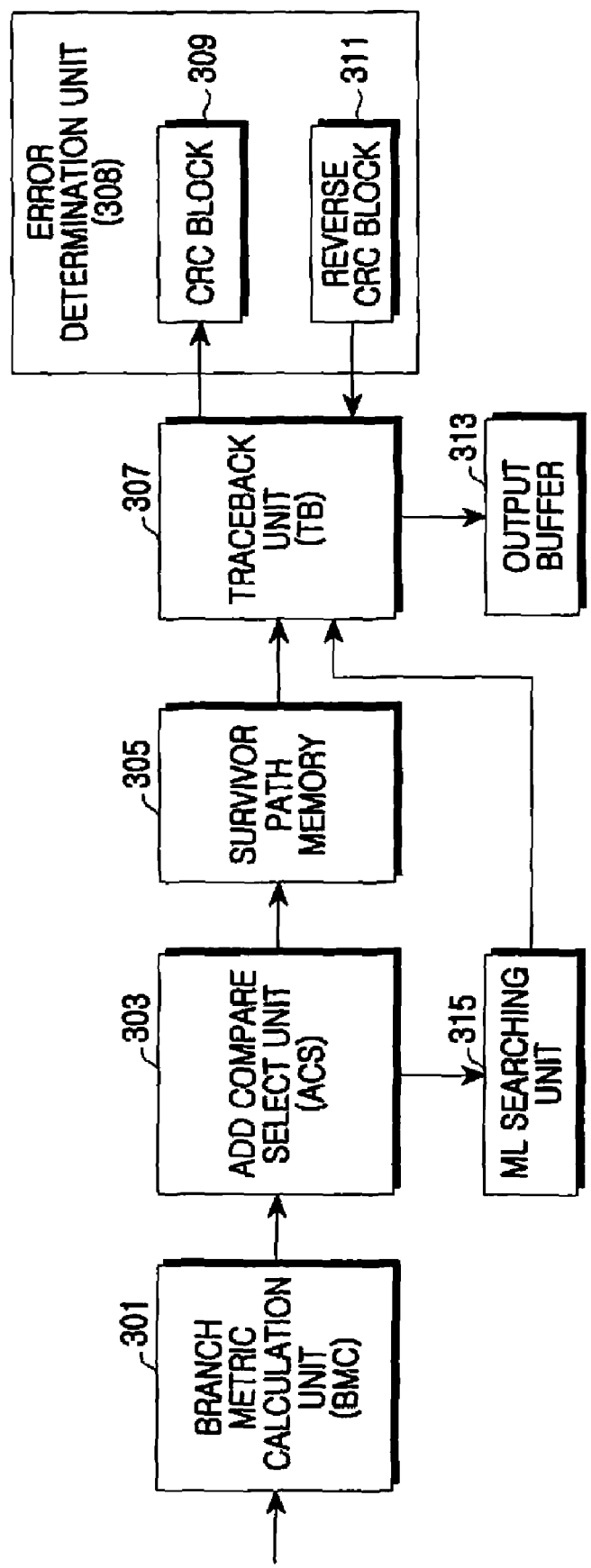
FIG. 3 is a block diagram illustrating the construction of a decoder according to an embodiment of the present invention.

FIG. 3 is a block diagram illustrating the construction of a decoder according to an embodiment of the present invention.

Referring to FIG. 3, the decoder can include a Branch Metric Calculation (BMC) unit 301, an Add Compare Select (ACS) unit 303, a survivor path memory 305, a traceback (TB) unit 307, an error determination unit 308, an output buffer 313, and an ML searching unit 315. The error determination unit 308 can include a CRC block 309 and a reverse CRC block 311.

The BMC unit 301 calculates an approximate degree between reception data input to the BMC unit 301 of the decoder and a predetermined code sequence output from an encoder, and outputs a Branch Metric (BM).

The ACS unit 303 performs addition and comparison using, as inputs, the BM calculated by the BMC unit 301 and a metric of a previous state that has been stored in advance, in order to select a survivor path of each state most approximate to a transmitted code sequence, and calculates a state metric of the survivor path. Selected survivor path information is stored in the survivor path memory 305.

The traceback unit 307 performs a traceback operation on a path having a high probability that the path is an original path through which transmission has been made based on information stored in the survivor path memory 305.

The error determination unit 308 determines if an error has been found according to a CRC check. Here, the error determination unit 308 of the decoder performs a CRC check and a reverse CRC check operating the CRC check in a reverse order, simultaneously, to determined if an error has been generated. Unlike a decoder of a general mobile system, the error determination unit 308 performs the CRC check and the traceback operation, simultaneously, in order to solve a delay limitation caused by the CRC check.

The CRC block 309 of the error determination unit 308 arbitrarily sets an initial register value of the CRC block 309, and determines if an error has been generated by comparing a CRC value attached to the end of input data with the initial register value.

The reverse CRC block 311 of the error determination unit 308 can be formed by making a connection path opposite to that of the CRC block 309 and forming the same structure as that of the CRC block 309. That is, the reverse CRC block 311 sets an initial register value to a CRC value of input data, receives the input data in a reverse order, and determines if an error has been generated using the initial value of the reverse CRC block 311.

Thus far the apparatus for improving a decoding performance in a mobile communication system has been described. Hereinafter, a method for improving a decoding performance in a mobile communication system using the above-described apparatus according to the embodiment of the present invention will now be described.

Figure 4:
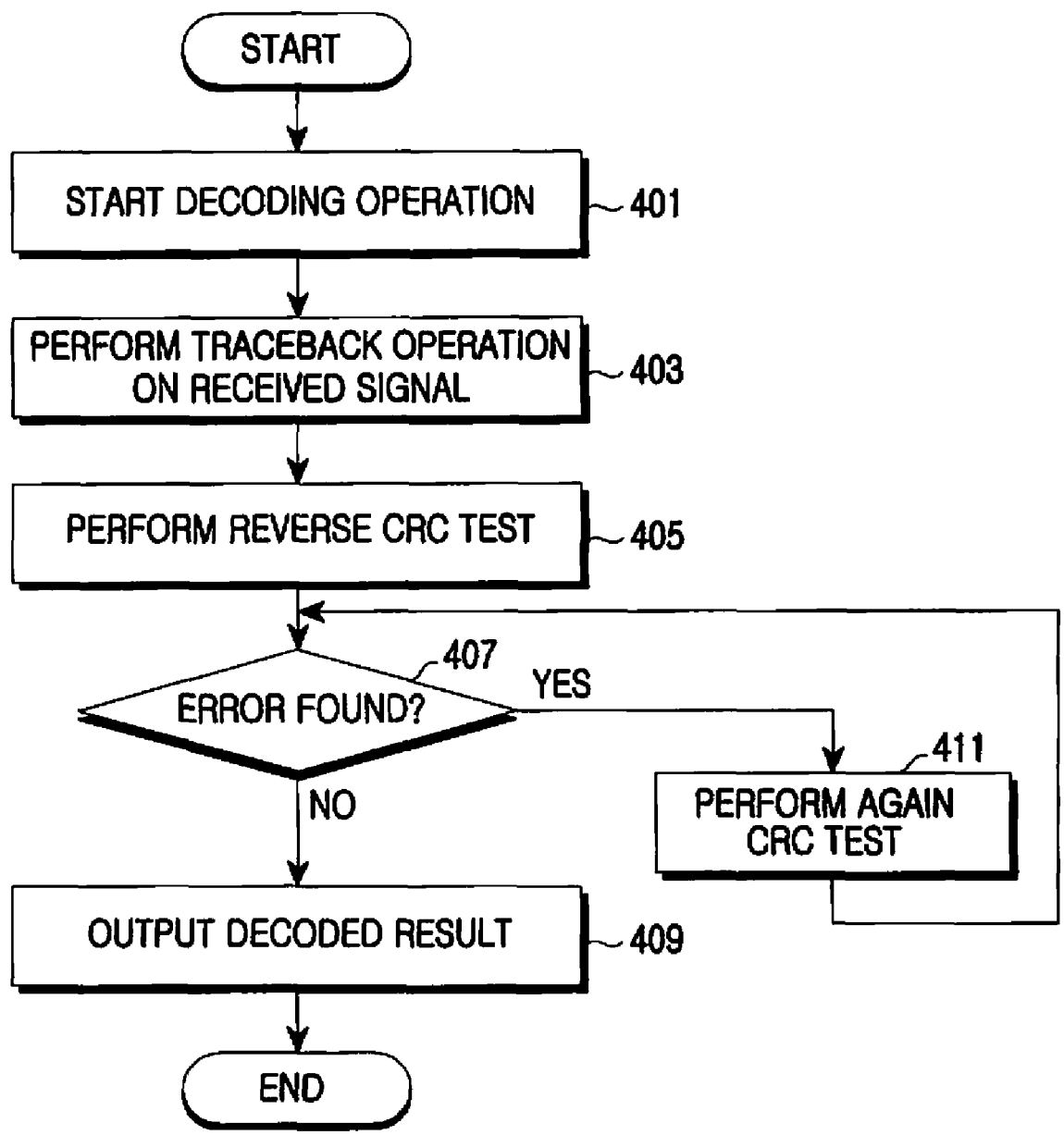
FIG. 4 is a flowchart illustrating a decoding operation of a decoder according to an embodiment of the present invention.

FIG. 4 is a flowchart illustrating a decoding operation of a decoder according to an embodiment of the present invention.

Referring to FIG. 4, the decoder starts a decoding operation in step 401, and performs a traceback operation on a received signal in step 403.

After that, the decoder performs a reverse CRC check in step 405, and determines if an error has been generated according to the reverse CRC checkin step 407. Here, unlike a decoder of a general mobile system, the decoder performs the traceback operation and the reverse CRC check simultaneously in order to solve a delay limitation caused by the CRC check. A method for solving a delay caused by the CRC check in the decoder will be described with reference to FIG. 5.

When it is determined that an error has been generated according to the reverse CRC check, the decoder again performs the reverse CRC check in step 411.

Meanwhile, when it is determined that an error has not been generated according to the reverse CRC, the decoder outputs a corresponding decoded result in step 409, and ends the process.

Though FIG. 4 illustrates the reverse CRC process, which is an error check process, is performed simultaneously with the traceback operation according to the exemplary embodiment of the present invention, the present invention can be similarly applied to all error check processes as well as the reverse CRC process.

Figure 5:
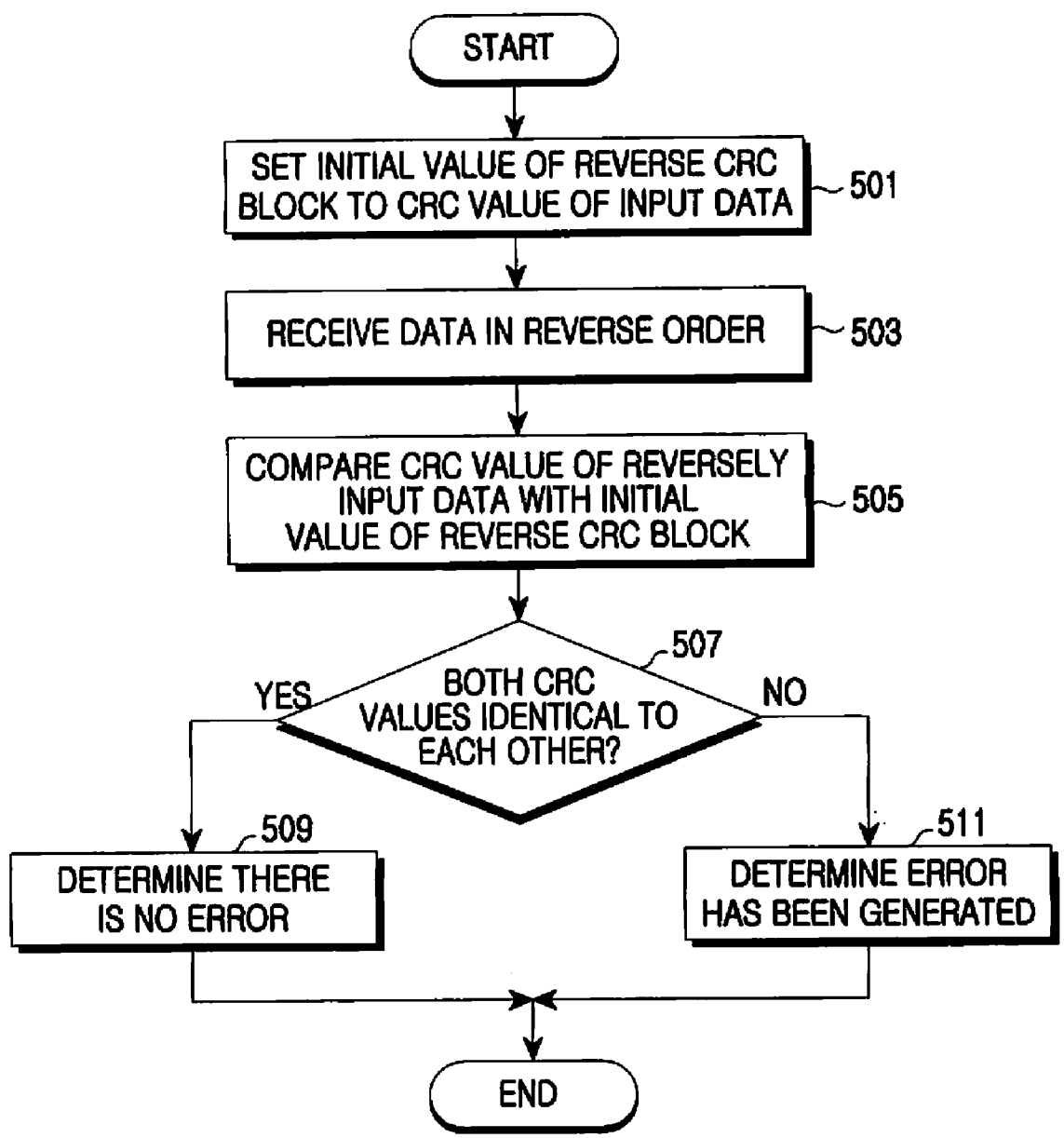
FIG. 5 is a flowchart illustrating an operation process of a decoder for improving a decoding performance according to an exemplary embodiment of the present invention.

FIG. 5 is a flowchart illustrating an operation process of a decoder for improving a decoding performance according to an embodiment of the present invention. Here, the operation process of the decoder is described on the assumption that a reverse CRC check and a traceback operation are simultaneously performed on a received signal.

Referring to FIG. 5, the decoder sets an initial register value of a reverse CRC block to a CRC value of input data in step 501, and again receives the input data in a reverse order in step 503.

After that, in step 505, the decoder compares a CRC value of the reversely input data with the initial register value set in step 501, and checks a comparison result of step 505 in step 507.

When the CRC value of the reversely input data and the initial register value are identical to each other as a result of the comparison in step 505, the decoder determines there is no error in step 509.

Meanwhile, when the CRC value of the reversely input data and the initial register value are not identical to each other as a result of the comparison in step 505, the decoder determines that an error has been generated in step 511.

For example, in the case where the decoder receives data whose CRC value is "11 . . . 11", the decoder sets an initial register value of a reverse CRC block to "11 . . . 11", which is the same value as the CRC value of the input data, and reversely receives the input data. After that, the decoder compares a CRC value of the reversely input data with the initial value of the reverse CRC block. When the CRC value of the reversely input data and the initial value of the reverse CRC block are identically "11 . . . 11", the decoder determines that there is no error. When the CRC value of the reversely input data and the initial value of the reverse CRC block are not both equal to "11 . . . 11", the decoder determines that an error has been generated.

After that, the decoder ends the process.

Figure 6A:
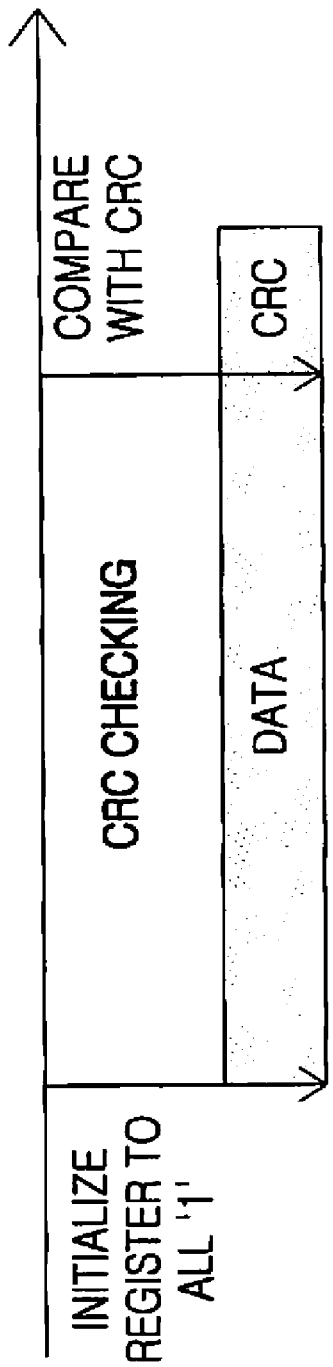
FIG. 6A is a diagram illustrating a CRC check process of a decoder according to an embodiment of the present invention.

FIG. 6A is a diagram illustrating a CRC check process of the decoder according to an embodiment of the present invention.

Referring to FIG. 6A, the decoder sets all initial register values of a CRC block to "11 . . . 11" and receives input data.

Accordingly, the decoder determines if there is an error according to the CRC check by comparing a CRC value attached to the end of the input data with "11 . . . 11", which is the initial register value.

Figure 6B:
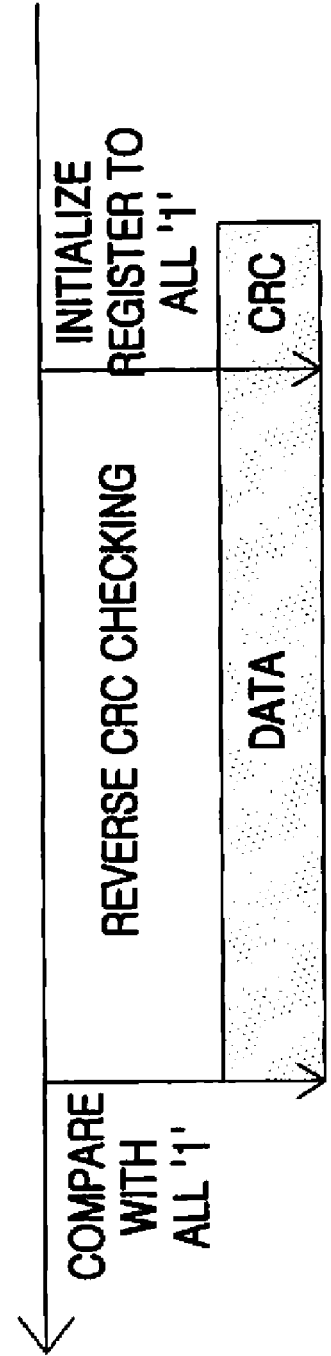
FIG. 6B is a diagram illustrating a reverse CRC check process of a decoder according to an embodiment of the present invention.

FIG. 6B is a diagram, illustrating a reverse CRC check process of a decoder according to an embodiment of the present invention.

Referring to FIG. 6B, the decoder sets all initial register values of a reverse CRC block to a CRC value of input data received in advance, and again receives in a reverse order the input data received in advance.

Accordingly, the decoder determines if there is an error according to the reverse CRC check by comparing a CRC value attached to the end of the reversely input data with the CRC value of the input data received in advance, which is the initial register value.

Figure 7:
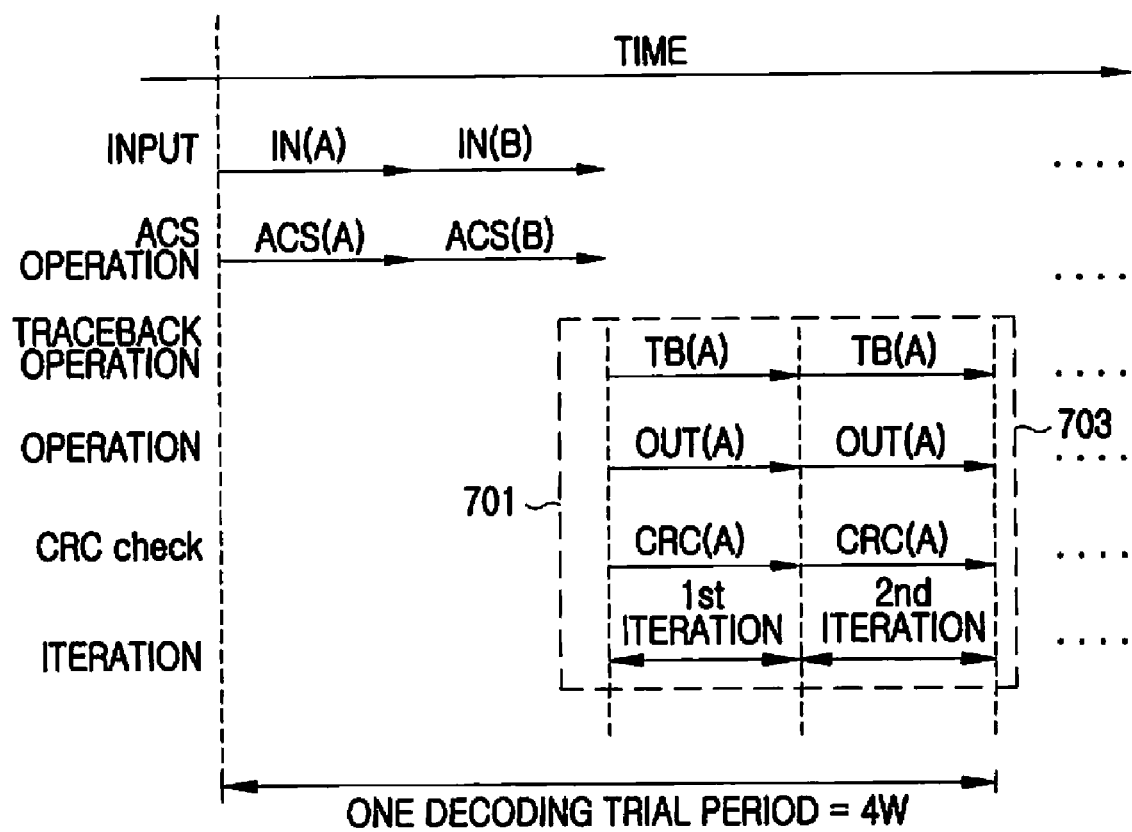
FIG. 7 is a timing diagram illustrating an operation process of a decoder according to an embodiment of the present invention.

FIG. 7 is a timing diagram illustrating an operation process of a decoder according to an exemplary embodiment of the present invention.

Referring to FIG. 7, in the case of receiving an input signal, the decoder performs an ACS operation on the input signal and performs a traceback operation. Here, the decoder outputs a result regarding the traceback operation, and simultaneously performs a reverse CRC process (701). At this point, when checking if an error has been generated according to the reverse CRC check, the decoder outputs a result regarding a second traceback operation, and simultaneously again performs a reverse CRC process (703).

The operation time of the above-described decoder is compared with that of a conventional decoder with reference to the accompanying drawings.

Figure 1:
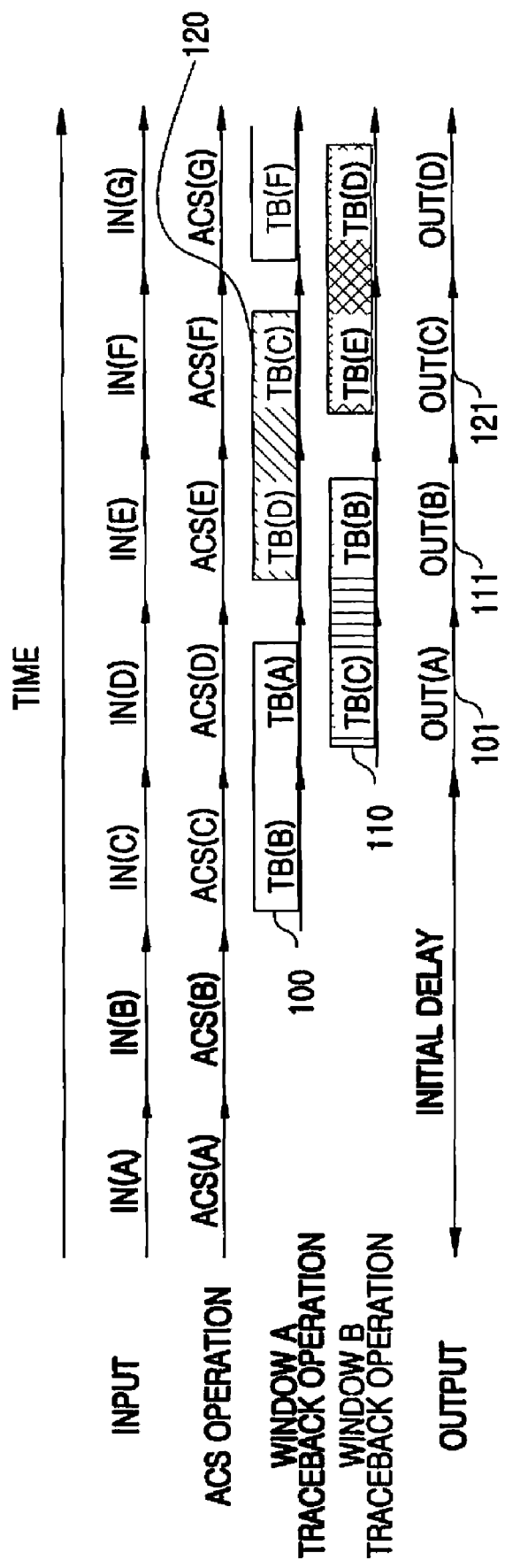
FIG. 1 is a timing diagram illustrating an operation of a decoder through a traceback operation of a general mobile communication system.
Figure 2:
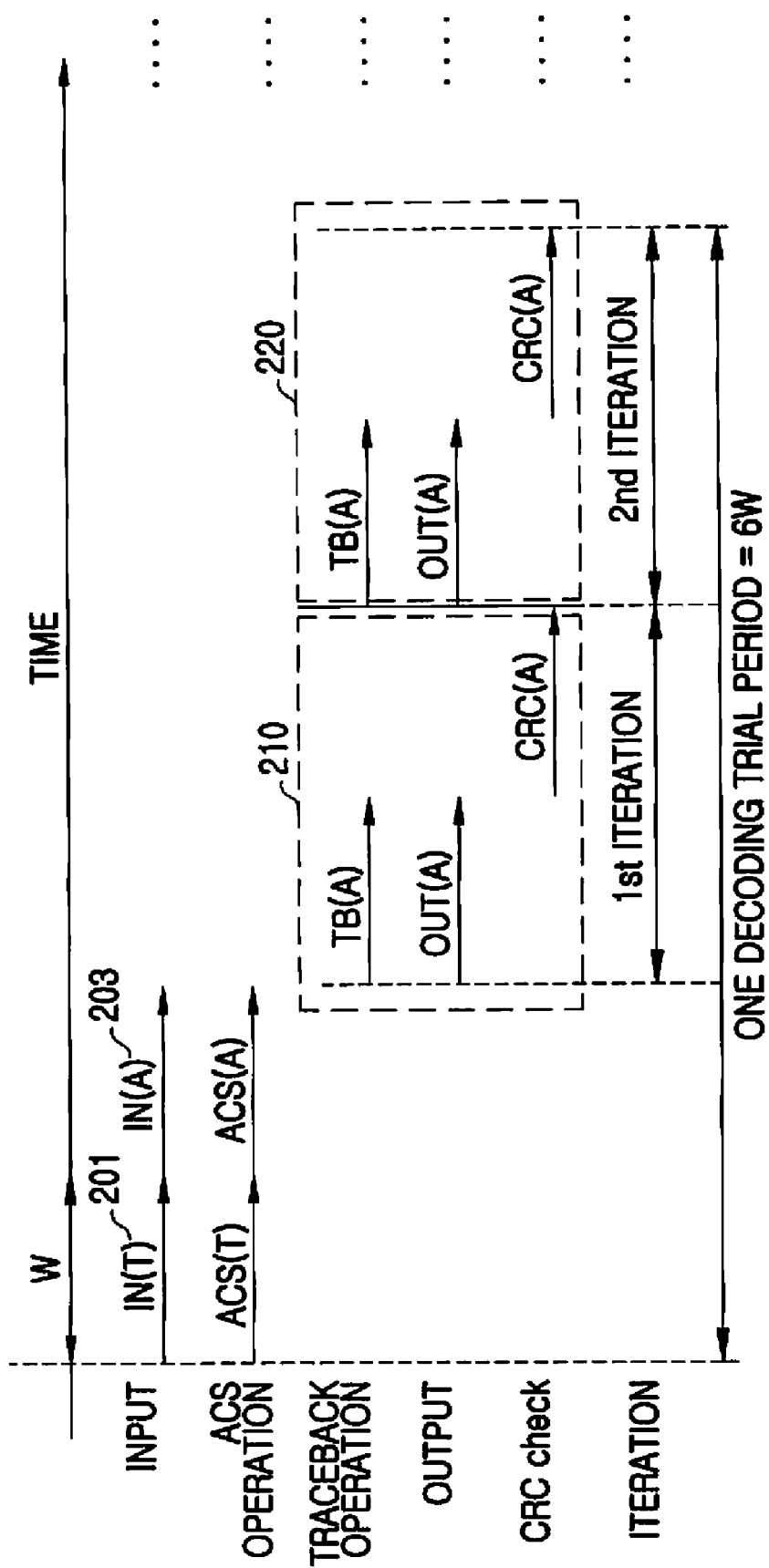
FIG. 2 is a timing diagram illustrating another operation of a decoder through a traceback operation of a general mobile communication system.

First, assuming that a decoder according to the present invention and a conventional decoder operate under the same circumstance before the operation times of the two decoders are compared, a decoding time of the conventional decoder is 6 W (refer to FIG. 2 in Description of Related Art section), and a decoding time of the decoder according to the present invention is 4 W. In other words, when the decoder according to the present invention is used, a processing time can be shortened by 2 W in comparison with the decoding time of the conventional decoder, which means the decoding performance improves by about ⅓ compared with the decoding performance of the conventional decoder.

Figure 8:
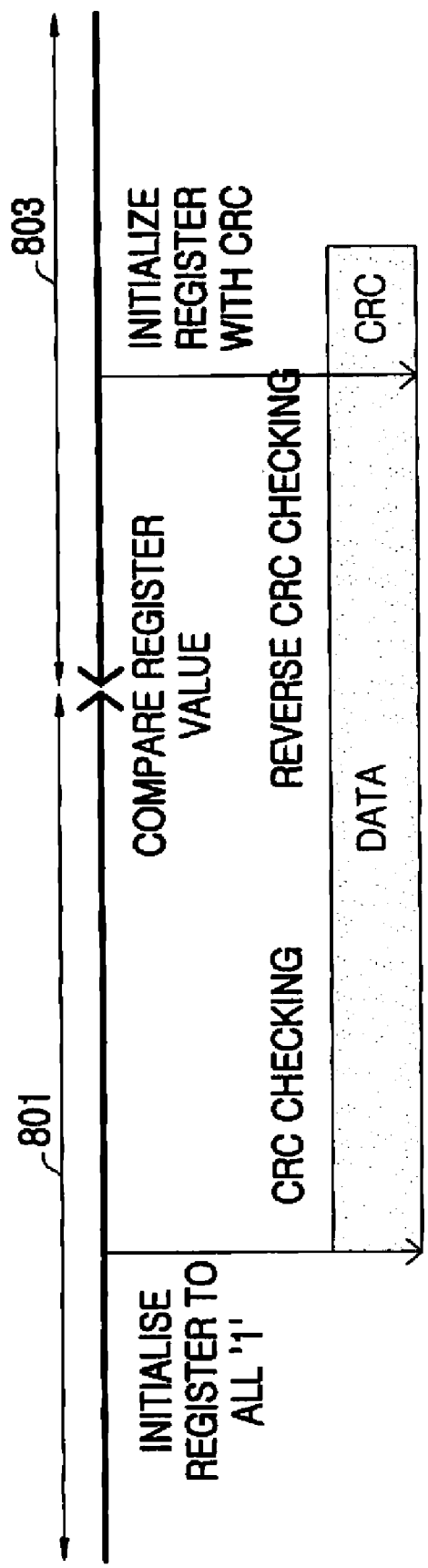
FIG. 8 is a diagram illustrating a CRC check process of a decoder according to another embodiment of the present invention.

FIG. 8 is a view illustrating a CRC check process of a decoder according to another exemplary embodiment of the present invention.

Referring to FIG. 8, as described above, the decoder performs a reverse CRC check and a CRC check simultaneously. The above error check process is a method for shortening the time needed to perform an error check in the case where a decoding bit is long. In this method, a CRC check is performed in the left side (801), and a reverse CRC check is performed in the right side (803), so that whether an error has been generated is determined by determining if the register values of the two sides are identical to each other at an intermediate point. In other words, the decoder sets initial register values of a CRC block to "11 . . . 11", and sets initial register values of a reverse CRC block to a CRC value of input data in order to simultaneously determine if an error has been generated.

As described above, to improve a decoding performance of a mobile communication system, the present invention can reduce a time required to perform a traceback operation, and performing an error check process such as a reverse CRC check, which is a reverse process of a CRC check, and thus shorten a decoding time. The decoder to which the present invention is applied can shorten the decoding time of a decoder used for a general mobile communication system to ⅔ of the prior art.

Although the invention has been shown and described with reference to certain preferred embodiments thereof, it will be understood by those skilled in the art that various changes in form and details may be made therein without departing from the spirit and scope of the invention as defined by the appended claims. Therefore, the scope of the present invention should not be limited to the above-described embodiments but should be determined by not only the appended claims but also the equivalents thereof.

What is claimed is:

1. An apparatus for improving a decoding performance in a mobile communication system, the apparatus comprising:
an error determination unit for performing a traceback operation on a received signal, and simultaneously determining if an error has been generated in the received signal, and when an error has been generated, again determining if an error is generated, and when an error has not been generated, outputting a decoded result.

2. The apparatus of claim 1, wherein the error determination unit determines if an error has been generated by performing a reverse Cyclic Redundancy Check (CRC) check operating a CRC check in a reverse order.

3. The apparatus of claim 2, wherein the error determination unit determines if an error has been generated by performing the CRC check and the reverse CRC check simultaneously.

4. The apparatus of claim 3, wherein the error determination unit performs the CRC check to determine if an error has been generated by comparing an initial register value of a CRC block with a CRC value of input data.

5. The apparatus of claim 3, wherein the error determination unit performs the reverse CRC check to determine if an error has been generated by comparing an initial register value of a reverse CRC block with a CRC value of input data received in advance.

6. The apparatus of claim 4, wherein the error determination unit sets the initial register value of the CRC block, and when the CRC value of the input data and the initial register value are identical to each other as a result of the comparison determines that there is no error.

7. The apparatus of claim 5, wherein the error determination unit sets the initial register value of the reverse CRC block to the CRC value of the input data received in advance, receives in a reverse order the input data received in advance, compares a CRC value attached to the end of the input data received in the reverse order with the initial register value of the reverse CRC block, and when the two values are identical to each other as a result of the comparison determines that there is no error.

8. A method for improving a decoding performance in a mobile communication system, the method comprising:
  performing, by an error determination unit, a traceback operation on a received signal, and simultaneously determining if an error has been generated in the received signal;
  when the error has been generated, again determining if an error has been generated; and
  when the error has not been generated, outputting a decoded result.

9. The method of claim 8, wherein the determining if an error has been generated comprises a reverse CRC check performing a CRC check in a reverse order.

10. The method of claim 9, wherein the determining if an error has been generated comprises performing the CRC check and the reverse CRC check simultaneously.

11. The method of claim 10, wherein the CRC check comprises determining if an error has been generated by comparing an initial register value of a CRC block with a CRC value of input data.

12. The method of claim 10, wherein the reverse CRC check comprises determining if an error has been generated by comparing an initial register value of a reverse CRC block with a CRC value of input data received in advance.

13. The method of claim 11, wherein the CRC check further comprises:
  after setting the initial register value of the CRC block, receiving data;
  comparing the CRC value of the input data with the initial register value;
  when the CRC value of the input data and the initial register value are identical to each other as a result of the comparison, determining that an error has not been generated; and
  when the CRC value of the input data and the initial register value are not identical to each other as a result of the comparison, determining that an error has been generated.

14. The method of claim 12, wherein the reverse CRC check further comprises:
  after setting the initial register value of the reverse CRC block to the CRC value of the input data received in advance, receiving in a reverse order the input data received in advance;
  comparing a CRC value attached to an end of the input data received in the reverse order with the CRC value of the input data received in advance, which is the initial register value;
  when the initial register value of the CRC block and the CRC value attached to the end of the input data received in the reverse order are identical to each other as a result of the comparison, determining that an error has not been generated; and
  when the initial register value of the CRC block and the CRC value attached to the end of the input data received in the reverse order are not identical to each other as a result of the comparison, determining that an error has been generated.

\* \* \* \* \*